United States Patent [19]

Cahill

[11] Patent Number: 5,083,304
[45] Date of Patent: Jan. 21, 1992

[54] AUTOMATIC GAIN CONTROL APPARATUS AND METHOD

[75] Inventor: Stephen V. Cahill, Palatine, Ill.

[73] Assignee: Motorola, Inc., Schaumburg, Ill.

[21] Appl. No.: 589,946

[22] Filed: Sep. 28, 1990

[51] Int. Cl.⁵ .......................................... H04L 27/08
[52] U.S. Cl. ...................................... 375/98; 455/239; 330/278
[58] Field of Search ........................ 375/10, 98, 102; 455/226, 234, 246, 265, 303, 239; 364/715.01; 358/174; 330/278, 279

[56] References Cited

U.S. PATENT DOCUMENTS

| | | | |
|---|---|---|---|
| 3,936,599 | 2/1976 | Peil et al. | 375/98 |
| 4,479,253 | 10/1984 | Daniel, Jr. | 455/246 |
| 4,623,934 | 11/1986 | Taylor | 358/280 |
| 4,625,240 | 11/1986 | Yablonski et al. | 455/235 |
| 4,631,489 | 12/1986 | Laird et al. | 375/98 |
| 4,656,630 | 4/1987 | Miyo | 370/104 |
| 4,691,377 | 9/1987 | Yoshihara et al. | 455/256 |
| 4,712,212 | 12/1987 | Takai et al. | 370/104 |
| 4,747,065 | 5/1988 | West | 364/715 |
| 4,757,502 | 7/1988 | Meuriche et al. | 375/98 |
| 4,785,418 | 11/1988 | Pearce et al. | 364/715.01 |
| 4,792,991 | 12/1988 | Eness | 455/243 |
| 4,807,167 | 2/1989 | Green, Jr. | 364/571.04 |
| 4,829,593 | 5/1989 | Hara | 455/234 |
| 4,859,964 | 8/1989 | Jorgensen | 330/279 |
| 4,893,349 | 1/1990 | Eastmond et al. | 455/249 |

Primary Examiner—Stephen Chin
Attorney, Agent, or Firm—Roland R. Hackbart; Kenneth W. Bolvin; Anthony J. Sarli

[57] ABSTRACT

An automatic gain control apparatus and method which optimally adjusts the gain of an amplifier to compensate for time-varying energy levels of a received input signal. A control input signal for adjusting the gain of the amplifier is determined by the selective average energy level of a present input signal, the transfer function characteristic of the amplifier and a previous control signal. A fast loop response time maintains the energy level of the amplified output signal at a nominal level.

34 Claims, 3 Drawing Sheets

AUTOMATIC GAIN CONTROL APPARATUS AND METHOD

FIELD OF THE INVENTION

The present invention relates generally to communications receivers, and, more particularly, to a digital communication receiver with an automatic gain control apparatus and method which adjusts the gain of an amplifier using a control signal determined by the selective average energy level of a present input signal, the transfer function characteristic of the amplifier and the previous control signal. Reference is made to U.S. patent application Ser. No. 07/590,401 filed on Sept. 28, 1990, "A Carrier Recovery Method and Apparatus Having an Adjustable Response Time Determined by Carrier Signal Parameters", filed on behalf of Stephen Vincent Cahill on the same date herewith, containing related subject matter, and assigned to the assignee of the present invention.

BACKGROUND OF THE INVENTION

A radio communications system is comprised, at minimum, of a transmitter and a receiver. The transmitter and the receiver are interconnected by a radio-frequency channel to permit transmission of an information signal therebetween. A digital receiver will generally include an amplifier with a gain adjusted by a control signal. The process of adjusting the gain of a received signal using a control signal is called Automatic Gain Control (AGC).

Although the concept of AGC in radio signal reception is well understood, automatic gain control of Time Division Multiple Access (TDMA) signals presents new challenges to the land-mobile industry.

Increased usage of cellular communications systems has resulted, in many instances, in the full utilization of every available transmission channel of the frequency band allocated for cellular radio telephone communication. In wide band TDMA systems, such as the cellular system proposed for use in the United States, hereinafter called USDC for United States Digital Cellular, and RF channel is shared (time-division-multiplexed) among numerous subscribers attempting to access the radio system in certain ones of various time-division-multiplexed time slots. This permits transmission of more than one signal at the same frequency, using the sequential time-sharing of a single channel by several radio telephones. The time slots are arranged into periodically repeating frames thus, a radio communication of interest may be periodically discontinuous wherein unrelated signals are interleaved with signals transmitted in other time slots. The unrelated signals (of widely varying strength) must not influence the gain control of the signals of interest. Varying signal strength may be caused by distance loss or multipath fading. A formidable challenge then is to provide Automatic Gain Control of these periodically discontinuous TDMA signals.

The challenge is further enhanced by attemping to provide digital AGC in inexpensive receivers, specifically, those having Analog-to-Digital converters (A/D) with limited dynamic range. Since the received signal strength may vary by as much as 120dB in the hand-mobile environment, but 8-bit Analog-to-Digital (A/D) converters, moderately priced, for digital signal processing are limited to 48dB dynamic range, techniques must be developed for controlling the gain of the portions of the radio receiver prior to the A/D converters to keep the signal at the input to the A/D converters within the limited dynamic range of the A/D converters. The challenge then is to handle a 120dB range discontinuous signal with a 48dB device; otherwise, prohibitively expensive A/Ds with greater dynamic range must be utilized.

Certain operations necessary for new communications system protocols require the subscriber unit to tune its receiver to another channel, measure signal strength, and report the measured signal strength to the system. This operation provides the system with information about which channel has the strongest signal and hence can offer the best level of service to the subscriber unit. The system may then direct the unit to change the channel with which it communicates with the system. This process is called Mobile Assisted Handoff, or MAHO.

This operation provides a very limited time for measuring the power of the to-be-tested channel, since the testing operation must be done during idle periods of the discontinuous signalling. Therefore, a fast AGC response time is needed to normalize the received signal strength energy level within the range of the A/D converters. Conventional AGC control loops are difficult to implement with rapid and accurate response times. This is because AGC control loops, conventionally implemented, include the channel selectivity filters or matched filters in the control loop. These filters have multiple poles and possibly zeros, hence the gain control signal must be filtered additionally by a low-pass filter with a much lower cutoff frequency to insure that the loop response is stable. This low-pass filter, for a conventional AGC system, has a slow response time, and hence limits the response time of the AGC loop.

Additional A/D converter and signal processing methods have delay which also adds to the loop's response time and instability. Conventional operation for AGC function using a signal processor requires a periodic calculation cycle, at the end of which a new gain control signal is generated which replaces the present gain control signal. This periodic calculation cycle is an artifact of the discrete-time nature of signal processors.

Since the received signal energy level is measured after the receiver's base band filtering and the A/D converters, the average signal energy level measured over the span of time since the last calculation cycle was performed and the last gain control signal was generated, will include both energy level measurements generated by the receiver response to the present gain control signal, as well as energy level measurements generated by the receiver response to the previous gain control signal, Thus, when a new gain control signal is issued by the signal processing element, a period of time elapses before the signals present at the inputs to the signal processing element begin to respond to those changes, and a further period of time elapses before the response to the new gain control signal has completed.

The energy level effects remaining from the previous received signal, received during present calculation cycle span, but in response to the previous control signal, result in an inaccurate estimate of the present received signal energy level, and hence potential instability in the AGC control loop.

The AGC problem is further complicated by the fact that the input signal level multiplies the gain of the control loop, hence, when a gain error due to change in received signal level occurs, the loop response time is affected by how much gain error is present.

Yet another challenge for automatic gain control is introduced by variation in gain of the receiver signal amplifiers, and in effective delay through receiver filters, due to temperatures and manufacturing tolerances. For a conventional AGC method, further restriction of the loop's response time must be made to assure stability with variations in gain and filter characteristics.

This invention takes as its initiative to overcome these challenges and realize certain advantages, presented below.

SUMMARY OF THE INVENTION

An automatic gain control apparatus including an adjustable gain amplifier. The adjustable gain amplifier having a received input signal, a control input signal, and an amplified output signal. The adjustable gain amplifier having a transfer function characteristic, with an associated inverse transfer characteristic, determining the amplified output signal responsive to the control input signal. The received input signal having time-varying energy levels.

The automatic gain control apparatus comprising means, responsive to the inverse transfer function characteristic and the amplified output signal, for determining an energy level error correction signal; means for determining a previous control input signal; and means, responsive to said energy level error correction signal and said previous control input signal, for determining the control input signal.

DETAILED DESCRIPTION OF THE PREFERRED EMBODIMENT

Figure 1:
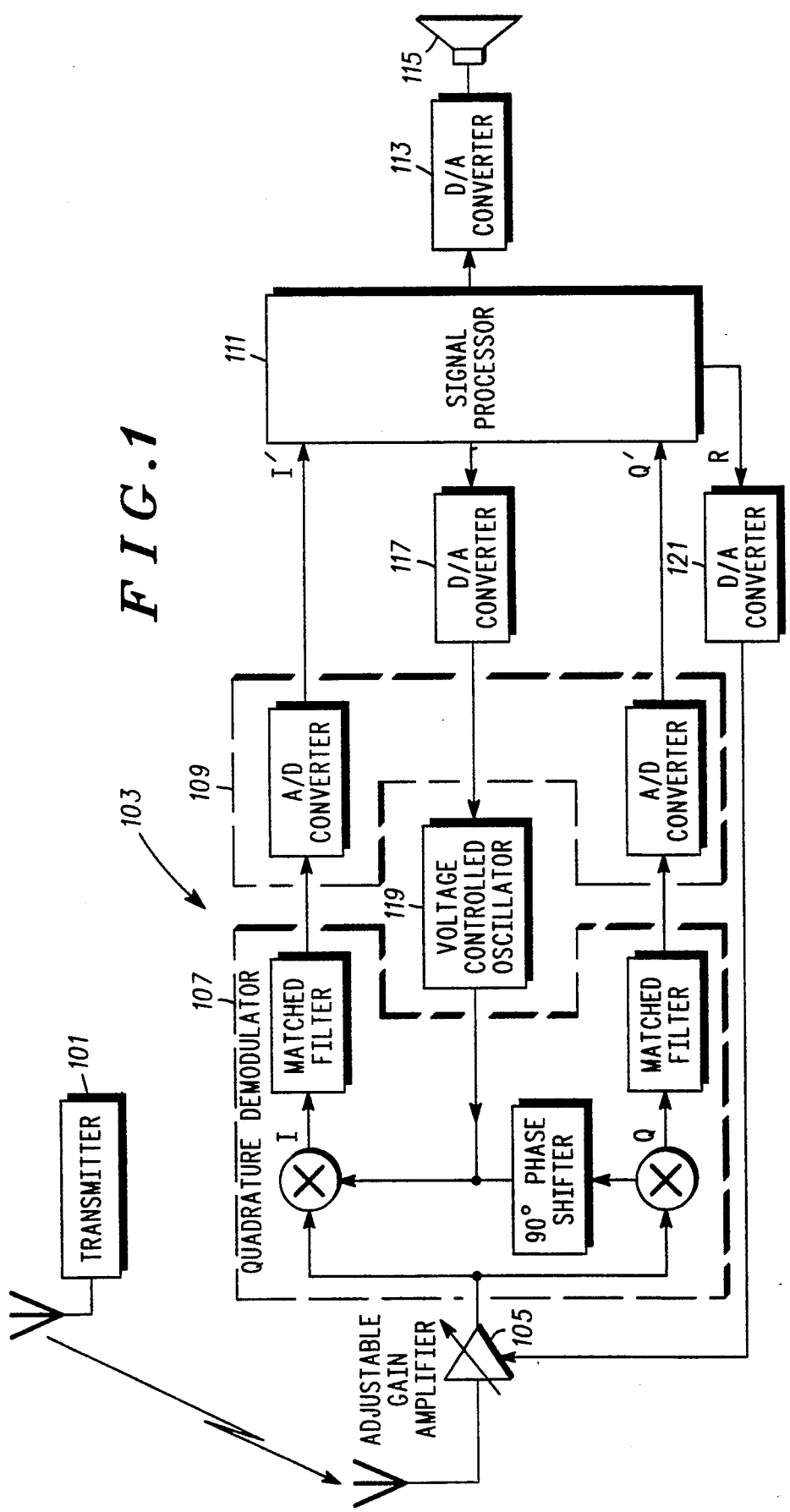
FIG. 1 is a block diagram of a transmitter and receiver which may employ the present invention.

FIG. 1 shows a transmitter 101 and a receiver 103 which may employ the present invention. The simplified block diagram of a receiver 103 illustrates automatic gain control in a digital quadrature receiver. In general, the receiver 103 illustrates a quadrature demodulator having In-phase and Quadrature phases (I/Q) 107, Analog-to-Digital converters (A/D) 109, a signal processor 111, and Digital-to-Analog converters (D/A) 117, 113, 121 provding control signals to a voltage controlled oscillator 119, a speaker 115, and an adjustable gain amplifier 105.

In the receiver operation, the signal is received, amplified by an adjustable gain amplifier 105, quadrature demodualted (I/Q) into In-phase and Quadrature components using quadrature demodulator circuitry 107; digitized by Analog-to-Digital converters of limited dynamic rang (A/D) 109; and converters to a power sample in signal processor 111 to detect the energy level of the signal. The signal processor 111 has three outputs. The first output goes to the Digital-to-Analog converter (D/A) 113 which is coupled to the speaker 115. The speaker 115 produces a voice signal which is an estimate of the voice signal sent from the transmitter 101, said voice signal being a portion of the information present in the received signal, quadrature encoded prior to transmission by transmitter 101, and decoded in signal processor 111 using known techniques. The second output of the signal processor 111 is coupled to the D/A converter 117. The output of the D/A converter 117 is a phase error estimate signal used to adjust the phase of the voltage controlled oscillator 119. The voltage controlled oscillator 119 produces a reference phase for the quadrature demodulator 107. Reference is made to U.S. patent application Ser. No. 07/590,401 filed on Sept. 28, 1990, "A Carrier Recovery Method and Apparatus Having an Adjustable Response Time Determined by Carrier Signal Parameters", filed on behalf of Stephen Vincent Cahill on the same date herewith, containing related subject matter and assigned to the assignee of the present invention. The third output of the signal processor 111 is coupled to a D/A converter 121. The output of the D/A converter 121 is control signal coupled to the adjustable gain amplifier 105.

The received signal energy level may vary due to multipath fading conditions, and varition in distance from the transmitter. The digitized quadrature signals (I'/Q') may have an energy level which is too high or too low when compared to an expected normalized value.

The preferred embodiment of the present invention discloses an apparatus and method which generates a control signal as an input to the adjustable gain amplifier 105 such that the change in received signal energy level at the output of the adjustable gain amplifier 105 is minimized, and the generation of said control signal is performed using an apparatus and method which results in a response to changes in received signal level which produces substantially correct signal level at the input to the A/D converter after one signal processing calculation cycle. As the received signal energy level changes, a new control signal is derived for the input of the adjustable gain amplifier 105 using the estimated gain-versus-control signal transfer function of the adjustable gain amplifier 105. A change in energy level of the received signal from the output of the adjustable gain amplifier 105 is processed in the signal processor 111 to generate a corrected control signal. The corrected control signal adjusts the gain of the amplifier 105 which produces an energy level output from the adjustable gain amplifier 105 with zero error. The preferred embodiment of the present invention provides the advantage over other types of AGC methods in that it rapidly adjusts the energy level input to the signal processor 111 to a normalized value by means of selectively averaging the signal energy presented to the signal processor, discarding those portions of the signal energy which accumulate during the early period of time in the signal processing calculation cycle when the effects of the previous gain control signal are still present. This discarding of delayed signal energy permits the generation of a gain control signal which exactly corrects the energy level to a normalized value, by means of the determination of the error in present gain, unaffected by previous gain control signal effects.

Figure 2:
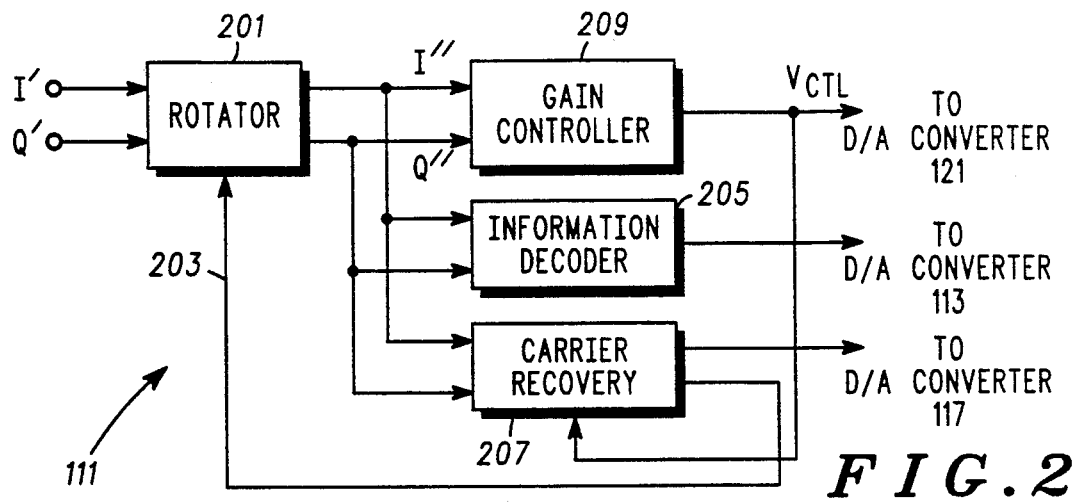
FIG. 2 is a block diagram of a signal processor which may employ the present invention.

Now referring to FIG. 2 there is shown a block diagram of signal processor 111 which may employ the present invention. Digitilzed quadrature input signals I'/Q' are coupled to a rotator 201. The rotator 201 has an oscillator which is controlled by a phase error estimate signal 203. The rotator 201 produces quadrature outputs, I" and Q", having zero phase error and unitary gain.

The information decoder 205, receives its input signals, I" and Q", to produce an approximation to the originally transmitted signal.

The carrier recovery function uses its received quadrature inputs, I" and Q", the produce a phase error estimate signal 203 to adjust the phase of a reference signal relative to the phase of a received signal.

The purpose of a gain controller 209 is to generate a control signal ($V_{CTL}$) at its output determined by its quadrature input signals I" and Q". The control signal is used to adjust the gain of the adjustable gain amplifier 105. The adjustable gain amplifier 105 normalizes the received signal energy levels prior to the A/D converters 109 to fall within the useful dynamic range of the A/D converters 109.

Figure 3:
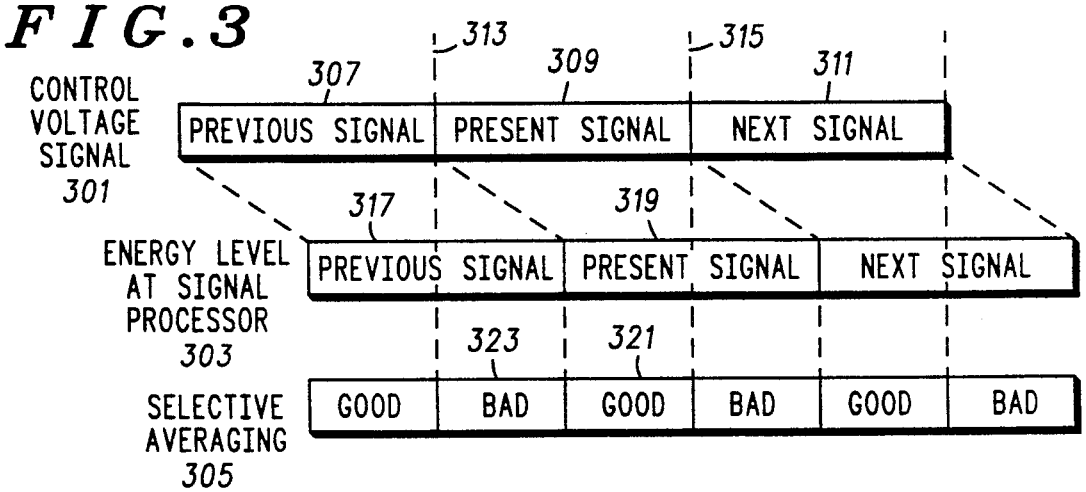
FIG. 3 is a signal timing diagram showing a delay caused by the loop's slow response time which may employ the present invention.

Now referring to FIG. 3 there is shown a timing diagram of the delay caused by the loop's response time prior to a signal processor 111. The timing diagram shows three signal patterns; a control signal 301, an energy level at the signal processor 303, and selective averaging of a signal 305. The control signal 301 is the adjustable control input to the adjustable gain amplifier 105. The control signal 301 is divided into three frames. The first frame is the time slot of the previous signal 307. The second frame is the time slot of the present signal 309. The third frame is a time slot for the next signal 311. The signal state of the energy level at the signal processor 303 is also divided into the same three time frames. The energy level of the signal at the processor 303 is offset, or delayed, from the control signal 301 due to the slow response time of the matched filters in the quadrature demodulator 107 and the A/D converters 109. One time slot for the present signal 309 is included between the event markers 313 and 315. During that time slot, the energy level at the signal processor 303 actually measures a portion of the previous signal 317 and a portion of the present signal 319. It is not desirable to include information from the previous signal 317 when determining an average energy level for the present signal 319. The preferred embodiment of the present invention discloses the advantage of selective averaging shown by the selective averaging signal 305. The selective averaging signal 305 shows good and bad information in each time frame. For any one time frame we only wish to keep the signal information from the present signal which is good information 321 and discard energy level measurements from the previous signal which are bad 323. The selective process of only averaging energy level measurements from the present signal 321 and not previous signals 323 is called selective averaging.

Figure 4:
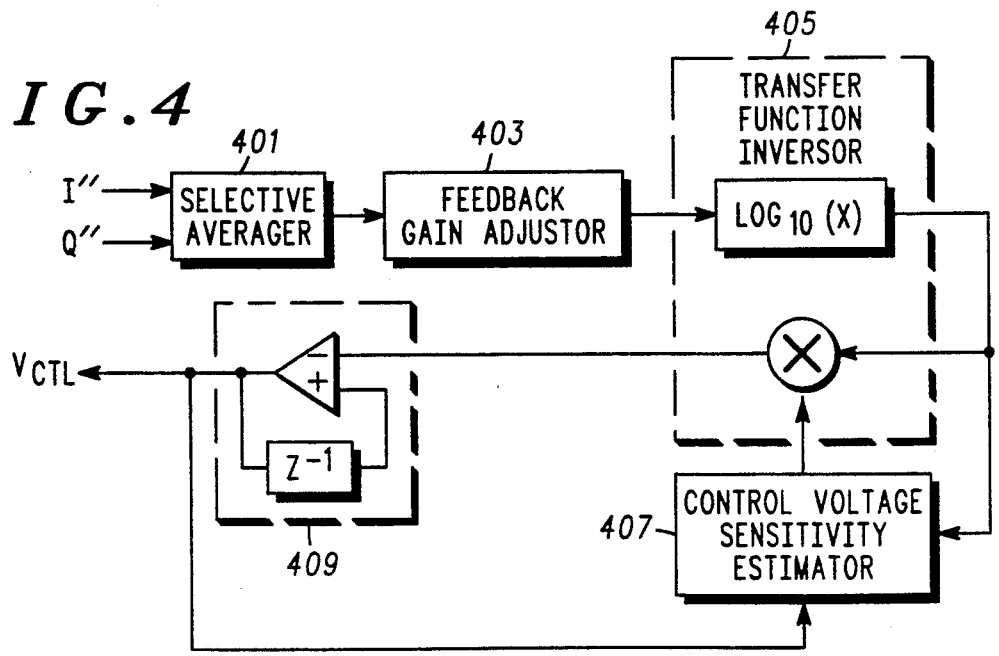
FIG. 4 is a block diagram of an automatic gain controller which may employ the present invention.

Now referring to FIG. 4 there is shown a block diagram of an automatic gain controller which may employ the present invention. Phased corrected quadrature component signals I" and Q" are coupled to selective averager 401. The selective averager 401 prodces a measure of the average energy level of the present received signal 321 while discarding information from the previously received signal 323. The output of the selective averager 401 may be described with the following equation:

$$E_{out} = (1/M)[\Sigma^{(from\ N-M\ to\ N)}(I'^2 + Q'^2)]$$

where $E_{out}$ is the average energy level output of selective averager 401, M is the amount of delay through the receiver filters and A/D devices, measured in A/D samples, N is the number of samples per calculation cycle of the AGC operation, and I" and Q" are inputs to selective averager 401.

The average energy measurement of the present signal 321 is coupled to a feedback gain adjuster 403 to produce a scaled normalized output. The feedback gain adjustor 403 scales the energy level to a useful level for further processing in a transfer function inversor 405. The scaling factor is a constant determined by hardware in the receiver 103.

Transfer function inversor 405 produces an energy level error correction signal output using inputs of the average scaled energy value from the feedback gain adjuster 403 and a slope estimate of gain versus control signal of the receiver adjustable-gain amplifier 105 from the control signal sensitivity estimator 407. The transfer function inversor 405 includes an inverse gain control transfer function estimate of the adjustable gain amplifier 105. Usually the gain control transfer function of an adjustable gain amplifier 105 is exponential times a constant. In this case, the transfer function inversor 405 would be a logarithmic operation. The transfer function inversor is not only limited to a logarithmic function. Any mathematical operation that yields a linear energy level error correction signal may be used.

The control signal sensitivity estimator 405 produces an estimate of the slope of the gain versus control signal of the adjustable gain amplifier 105. The past values of the control signals $V_{CTL}$, and energy level inverse signal from the transfer function inversor 405 are used to determine furture slope estimates. The output of a control signal sensitivity estimator 407 may be described by the following equation:

SCALE'(k) = SCALE'(k−1) − AL-
PHA[$V_{CTL}$(k−1) − $V_{CTL}$(k−2)-
][$E_{OUT}$(k−1) − 1][SCALE'(k−1)]

where SCALE'(k) is the present scaled slope estimate signal, ALPHA is a adaptation loop constant, $V_{CTL}$ is a control signal indexed through time, and $E_{OUT}$ is a scaled average energy level signal indexed through time.

The output of the transfer function inversor 405 is an energy level error correction signal. The goal of the AGC loop in the preferred embodiment of the present invention is to try to keep the energy error to be zero. The energy error correction signal is coupled to a subtractor 409. The subtractor 409 subtracts the energy error correction signal from the present control signal $V_{CTL}$ to generate a new control signal $V_{CTL}$. The net output at the subtractor 409 of the gain control signal generator may be described by the following equation, for a logarithmic transfer function inversor:

$$V_{CTL}(k) = V_{CTL}(k-1) - [SCALE'(k)/2]LOG_{10}[-K_S E_{out}(k-1)]$$

where $V_{CTL}$ (k) is the present control signal, SCALE'(k) is the present slope estimate signal, $K_S$ is a scaled gain factor and $E_{OUT}$ is a scaled average level signal.

The important elements of the AGC apparatus disclosed in this preferred embodiment of the present invention comprise a selective averager 401, a transfer function inversor 405, a control voltage sensitivity estimator 407 and a subtractor 409. The selective averager 401 determines an average energy level in a time slot for only a present signal 321. The averaged energy level value is scaled to a normalized value and coupled to transfer function inversor 405 which uses the normalized average energy value and an estimate of the slope of the gain versus control signal of the adjustable gain amplifier 105 to produce an output representing an energy level error correction signal. The energy level error correction signal may be a positive or negative value. This value is then subtracted from the present control signal to produce a new control signal which will adjust the adjutable gain amplifier 105 to produce an energy level at the output of the adjustable gain amplifier 105 at a normalized value, in a single cycle of calculation. When the receive signal encounters conditions that change the level of the energy value, the selective averager 401 determines a new average energy value which is further scaled by the feedback gain adjustor 403 and coupled to the transfer function inversor 405. The transfer function inversor 405 produces an output which has an energy level error signal value which would be subtracted from the now-present control signal thereby adjusting the gain of adjustable gain amplifier 105 to again normalize the energy level at the output of the adjustable gain amplifier 105. A key advantage of the implementation of the preferred embodiment is the speed at which the adjusted normalized energy level is determined. The accurate knowledge of the gain control transfer function of the adjustable gain amplifier 105, combined with the selective averaging over a span of samples generated only during the effect of the present control signal level 321, allows normalization in only a single cycle of the process by proper calculation of the next control signal, without detrimental effects due to poles and zeros introduced into the feedback loop by matched filter delay and A/D converter delay.

Figure 5:
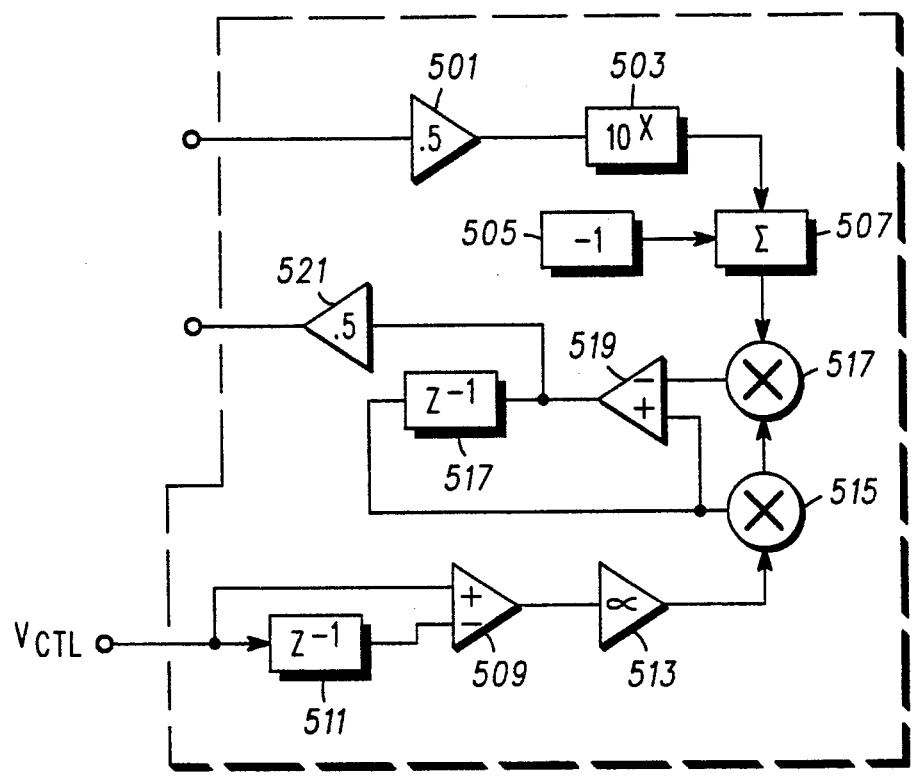
FIG. 5 is a block diagram of a control signal sensitivity estimator which may employ the present invention.

Now referring to FIG. 5 there is shown a block diagram of the control signal sensitivity estimator 407. The control voltage sensitivity estimator 407 produces a scaled slope estimate signal. The scale slope estimate signal is determined using the change, over time of the control signal and the energy level inverse signal. The change in control signal is determined by the difference between the present control signal ($V_{CTL}(k-1)$) and the previous control signal ($V_{CTL}(k-2)$ at the input of the adjustable gain amplifier 105. The energy level inverse signal is determined by the transfer function inversor 405.

Energy level inverse signal from the transfer function inversor 405 is coupled to a gain stage 501 which reduces the input signal by one-half. The gain stage 501 transforms the input log-energy-referenced signal into an output log-voltage-referenced signal. The gain stage of one-half being equivalent to taking a square root prior to the logarithmic operation. The output voltage signal is then coupled to $10^x$ function which compensates the signal for the exponential characteristics of the adjustable gain amplifier 105. The $10^x$ function 503 transforms log-referenced input signal into a linear-referenced output signal. A value of one 505 is subtracted from the linear-voltage-referenced signal in a summary function 507. The output of the summer function 507 is a linear-voltage referenced-estimation of the difference between the present energy level signal and an ideal normalized signal value of one, 505.

A differential amplifier 509 substracts the present control signal ($V_{CTL}(k-1)$) from the previous control ($V_{CTL}(k-2)$) signal. The previous control signal is determined by a unit delay function 511. The change in control signal output from the differential amplifier 509 is coupled to a gain stage 513. The gain stage 513 multiplies its input by a small number to produce a scaled output. The small number determines the response time for measuring the change in amplifier gain versus control signal characteristics. The small number is determined by the noise we wish to filter out of the receive signal, which perturbs the measurement of the response of the gain control process, which response is used to correct the estimate of the gain versus control characteristics of the adjustable-gain amplifier. Without the scaling factor the noise present in a receive signal could cause large and rapid fluctuations of estimate of the gain versus control signal of the adjustable-gain amplifier. By scaling the change in control voltage by a small number our average estimates are good but each individual meaurement could be off by a large amount due to noise. Therefore the scaling gain amplifier 513 gradually corrects the change in gain versus control voltage estimate without large fluctuations. The output of the gain amplifier 513 is coupled to a mixer 515 along with the output of a unit delay function 517. These inputs are combined to produce an output which is coupled to the mixer 517. The input from the mixer 515 is combined with the input from the summer 507 to produce an output for the differential amplifier 519. The differential amplifier 519 substracts the output from the mixer 517 from the output from the unit delay function 517 to produce an output which is coupled into the unit delay function 517 and also coupled to the gain amplifier 521. The output of gain amplifier 521 is coupled to the transfer function inversor 405. The mixers 515 and 517, differential amplifier 519, the unit delay function 517 and the gain stage 521 use the change in energy estimate and the change in control voltage estimate to produce a scaled slope estimate signal as its output.

An advantage of tracking the gain versus control signal transfer function of adjustable gain amplifier 105 is that characteristics specific to each physical amplifier can be taken into account. Individual characteristics of adjustable gain amplifier 105 of interest include variations in temperature response and manufacturing process tolerances.

I claim:

1. An automatic gain control apparatus including an adjustable gain amplifier, the adjustable gain amplifier having a received input signal, a control input signal, and an amplified output signal, the adjustable gain amplifier having a transfer function characteristic, with an associated inverse transfer function characteristic determining the amplified output signal responsive to the control input signal, the received input signal having time-varying energy levels, the automatic gain control apparatus comprising:

means, responsive to the inverse transfer function characteristic and the amplified output signal, for determining an energy level error correction signal;

means for determining a previous control input signal; and means, responsive to said energy level error correction signal and said previous control input signal, for determining the control input signal.

2. An automatic gain control apparatus in accordance with claim 1 further comprising:

means for determining an energy level inverse signal responsive to the amplified output signal;

means for determining a slope estimate signal responsive to the control signal and said energy level inverse signal; and means for combining said slope estimate signal and said energy level inverse signal to generate said energy level error correction signal.

3. An automatic gain control apparatus in accordance with claim 2 wherein said means for determining said energy level inverse signal further comprises:

means for determining an average energy level estimate signal responsive to the amplified output signal;

means for determining a normalized energy level signal responsive to said average energy level estimate signal; and means for determining the inverse transfer function characteristic of said normalized energy level signal to generate said energy level inverse signal.

4. An automatic gain control apparatus in accordance with claim 3 wherein said means for determining an average energy level estimate signal of the amplified output signal, further comprises:

means for locating in the amplified output signal a previous amplified output signal sequential to a present amplified output signal;

means for acquiring a first portion of said previous amplified output signal and a first portion of said sequential present output signal; and means for determining the average energy level responsive to substantially said first portion of the sequential present amplified output signal to generate a selective average energy level estimate signal.

5. An automatic gain control apparatus in accordance with claim 1 further comprising means for determining an average energy level estimate signal of the amplified output signal.

6. An automatic gain control apparatus in accordance with claim 5 wherein said means for determining an average energy level estimate signal of the amplified output signal further comprises:

means for locating in the amplified output signal a previous amplified output signal sequential to a present amplified output signal;

means for acquiring a first portion of said previous amplified output signal and a first portion of said sequential present output signal; and means for determining the average energy level of substantially said first portion of the sequential present amplified output signal to generate a selective average energy level estimate signal.

7. A method of automatic gain control including an adjustable gain amplifier, the adjustable gain amplifier having a received input signal, a control input signal, and an amplified output signal, the adjustable gain amplifier having a transfer function characteristic, with an associated inverse transfer function characteristic, determining the amplified output signal responsive to the control input signal, the received input signal having time-varying energy levels, the automatic gain control method comprising the steps of:

determining an energy level error correction signal responsive to the inverse transfer function characteristic and the amplified output signal;

determining a previous control input signal; and determining the control input signal responsive to said energy level error correction signal and said previous control input signal.

8. An automatic gain control method in accordance with claim 7 further comprising the steps of:

determining an energy level inverse signal responsive to the amplified output signal;

determining a slope estimate signal responsive to the control signal and said energy level inverse signal; and combining said slope estimate signal and said energy level inverse signal to generate said energy level error correction signal.

9. An automatic gain control method in accordance with claim 8 wherein said means for determining said energy level inverse signal further comprises the steps of:

determining an average energy level estimate signal responsive to the amplified output signal;

determining a normalized energy level signal responsive to said average energy level estimate signal; and determining the inverse transfer function characteristic of said normalized energy level signal to generate said energy level inverse signal.

10. An automatic gain control method in accordance with claim 9 wherein said means for determining an average energy level estimate signal of the amplified output signal, further comprises the steps of:

locating in the amplified output signal a previous amplified output signal sequential to a present amplified output signal;

acquiring a first portion of said previous amplified output signal and a first portion of said sequential present output signal and determining the average energy level of substantially said first portion of the sequential present amplified output signal to generate a selective average energy level estimate signal.

11. An automatic gain control method in accordance with claim 7 further comprising the step of determining an average energy level estimate signal of the amplified output signal.

12. An automatic gain control method in accordance with claim 11 wherein said means for determining an average energy level estimate signal of the amplified output signal further comprises the steps of:

locating in the amplified output signal a previous amplified output signal sequential to a present amplified output signal;

acquiring a first portion of said previous amplified output signal and a first portion of said sequential present output signal; and determing the average energy level of substantially said first portion of the sequential present amplified outut signal to generate a selective average energy level estimate signal.

13. An automatic gain control apparatus including an adjustable gain amplifier, the adjustable gain amplifier having a received input signal, a control inut signal, and an amplified output signal, the adjustable gain amplifier having a transfer function characteristic, with an associated inverse transfer function characteristic, determining the amplified output signal responsive to the control input signal, the received input signal having time-varying energy levels, the automatic gain control apparatus comprising:

means for determining an average energy level estimate signal of the amplified output signal;

means, responsive to the inverse transfer function characteristic and said average energy level estimate signal, for determining an energy level error correction signal;

means for determining a previous control input signal; and means, responsive to said energy level error correction signal and said previous control input signal, for determining the control input signal.

14. An automatic gain control apparatus in accordance with claim 13 further comprising:

means for determining an energy level inverse signal responsive to said average energy level estimate signal;

means for determining a slope estimate signal responsive to the control signal and said energy level inverse signal; and means for combining said slope estimate signal and said energy level inverse signal to generate said energy level error correction signal.

15. An automatic gain control apparatus in accordance with claim 13 further comprising means for determining a scaled average energy level estimate signal responsive to said average energy level estimate signal.

16. An automatic gain control apparatus in accordance with claim 13 wherein said means for determining an average energy level estimate signal of the amplified output signal, further comprises:

means for locating in the amplified output signal a previous amplified output signal sequential to a present amplified output signal;

means for acquiring a first portion of said previous amplified output signal and a first portion of said sequential present output signal; and mean for determining the average energy level of substantially said first portion of the sequential present amplified output signal to generate a selective average energy level estimate signal.

17. An automatic gain control apparatus in accordance with claim 16 further comprising means for determining a scaled selective average energy level estimate signal responsive to said selective average energy level estimate signal.

18. A method of automatic gain control including an adjustable gain amplifier, the adjustable gain amplifier having a received input signal, a control input signal, and an amplified output signal, the adjustable gain amplifier having a transfer function characteristic, with an associated inverse transfer function characteristic, determining the amplified output signal responsive to the control input signal, the received input signal having time-varying energy levels, the automatic gain control method comprising the steps of:

determining a selective average energy level estimate signal responsive to the amplified output signal;

determining an energy level error correction signal responsive to the inverse transfer function characteristic and said selective average energy level estimate signal;

determining a previous control input signal; and determining the control input signal responsive to said energy level error correction signal and said previous control input signal.

19. An automatic gain control method in accordance with claim 18 further comprising the steps of:

determining an energy level inverse signal responsive to said selective average energy level estimate signal;

determining a slope estimate signal responsive to the control signal and said energy level inverse signal; and combining said slope estimate signal and said energy level inverse signal to generate said energy level error correction signal.

20. An automatic gain control method in accordance with claim 18 further comprising the step of determining a scaled selective average energy level estimate signal responsive to said selective average energy level estimate signal.

21. An automatic gain control method in accordance with claim 18 wherein said step of determining a selective average energy level estimate signal responsive to the amplified output signal, further comprises the steps of:

locating in the amplified output signal a previous amplified output signal sequential to a present amplified output signal;

acquiring a first portion of said previous amplified output signal and a first portion of said sequential present output signal; and determining the average energy level estimate signal substantially of said first portion of the sequential present amplified output signal to generate said selective average energy level estimate signal.

22. An automatic gain control method in accordance with claim 21 further comprising the step of determining a scaled selective average energy level estimate signal responsive to said selective average energy level estimate signal.

23. An automatic gain control apparatus including an adjustable gain amplifier and a signal processor, the adjustable gain amplifier having a received input signal, a control input signal, and an amplified output signal, the adjustable gain amplifier having a transfer function characteristic, with an inverse transfer function characteristic, determining the amplified output signal responsive to the control input signal, the received input signal having a time-varying energy level, the signal processor having an input signal and an output signal, the amplified output signal of the adjustable gain amplifier coupled to the input signal of the signal processor, the output signal of the signal processor coupled to the control input signal of the adjustable gain amplifier, the automatic gain control apparatus comprising:

means for determining a selective average energy level estimate signal responsive to the amplified output signal;

means for scaling said selective average energy level estimate signal to generate a scaled selective average energy level estimate signal;

means, responsive to the inverse transfer function characteristic and said scaled selective average energy level estimate signal signal, for determining an energy level inverse signal;

means for determining a slope estimate signal of the adjustable gain amplifier transfer function characteristic responsive to the control signal and said energy level inverse signal;

means for combining said slope estimate signal and said energy level inverse signal to generate said energy level error correction signal;

means for determining a previous control input signal; and means for determining the control input signal responsive to said previous control input signal and said energy level error correction signal.

24. A digital cellular radiotelephone receiver in a TDMA system having an automatic gain control apparatus including an adjustable gain amplifier and a digital signal processor, the adjustable gain amplifier having a quadrature modulated received input signal, a linear control input signal, and an exponential amplified output signal, the adjustable gain amplifier having an exponential transfer function characteristic determining the exponential amplified output signal responsive to the linear control input signal, the received input signal having a time-varying energy level, the digital signal processor having an exponential input signal and a linear output signal, the exponential amplified output signal of the adjustable gain amplifier coupled to the exponential input signal of the digital signal processor, the linear output signal of the digital signal processor coupled to the linear control input signal of the adjustable gain amplifier, the automatic gain control apparatus comprising:

means for amplifing the gain of the quadrature modulated received input signal to produce an exponential amplified output signal;

means for delaying the quadrature modulated received input signal to produce a delayed exponential input signal for the digital signal processor;

means for determining a selective average estimate signal of an energy level of said delayed exponential input signal for the digital signal processor, said selective average substantially including said average estimate of said energy level of said delayed exponential input signal and substantially disregarding an average estimate of energy level of a previous delayed exponential input signal;

means for scaling said selective average estimate signal;

means for determining a linear energy level inverse signal from said scaled average estimate signal;

means for determining a new linear control signal from a difference between a previous linear control signal and the linear control signal;

means, responsive to said linear energy level inverse signal and said new linear control signal, to determine a linear slope estimate signal;

means, responsive to the product of said linear slope estimate signal and said new linear control signal, for determining an energy level error correction signal; and means, responsive to the difference between said previous linear control signal and said energy level error correction signal, to determine the linear control signal.

25. An automatic gain control apparatus including an adjustable gain amplifier and a signal delay means, the adjustable gain amplifier having a gain, relating an amplified output signal to a received input signal having time varying energy levels, responsive to a control input signal, and having a transfer function with an associated inverse transfer function relating the gain to the control input signal, the amplified output signal and the control input signal incur time delays determined by the signal delay means, the automatic gain control apparatus comprising:

means for determining an energy level error correction signal responsive to a present amplified output signal and a present control input signal;

means for determining a previous control input signal responsive to the signal delay means; and means for determining a next control input signal responsive to said energy level error correction signal and said previous control input signal to generate a next amplified output signal.

26. An automatic gain control apparatus in accordance with claim 25 wherein said means for determining said energy level error correction signal further comprises:

means for determining an energy level inverse signal responsive to the amplified output signal;

means for determining a slope estimate signal responsive to the present control signal and said energy level inverse signal; and means for combining said slope estimate signal and said energy level inverse signal to generate said energy level error correction signal.

27. An automatic gain control apparatus in accordance with claim 26 wherein said means for determining said energy level inverse signal further comprises:

means for determining a normalized energy level signal responsive to the amplified output signal; and means for determining the inverse transfer function of said normalized energy level signal to generate said energy level inverse signal.

28. An automatic gain control apparatus in accordance with claim 27 wherein said means for determining said normalized energy level signal further comprises:

means for determining a selective average energy level signal responsive to the amplified output signal; and means for scaling said selective average energy level signal to generate said normalized energy level signal.

29. An automatic gain control apparatus in accordance with claim 28 wherein said means for determining said selective average energy level signal further comprises:

means for locating a previous amplified output signal sequential to a present amplified output signal means for acquiring a first portion of said previous amplified output signal and a sequential first portion of said present amplified output signal; and means for determining the average energy level of said sequential first portion of the present amplified output signal to generate said selective average energy level signal.

30. An automatic gain control apparatus in accordance with claim 26 wherein said means for determining said slope estimate signal further comprises:

means for determining a change in said energy level inverse signal over a time period;

means for determining a change in the control input signal over said time period corresponding to said change in said energy level inverse signal; and means for determining said slope estimate signal responsive to said change in said energy level inverse signal and said change in said control input signal.

31. An automatic gain control apparatus in accordance with claim 26 wherein said means for combining further comprises a multiplier.

32. An automatic gain control apparatus in accordance with claim 25 further comprising means for determining said energy level error correction signal having essentially zero error responsive to said next amplified output signal.

33. An automatic gain control apparatus in accordance with claim 25 further comprising:

means for locating a previous amplified output signal sequential to said present amplified output signal;

means for acquiring a first portion of said previous amplified output signal and a first portion of said sequential present output signal;

means for determining the average energy level responsive to substantially said first portion of the sequential present amplified output signal to generate a selective average energy level estimate signal; and means for determining said energy level error correction signal responsive to said selective average energy level estimate signal and said present control signal.

34. A method of automatic gain control including an adjustable gain amplifier having a received input signal with time-varying energy levels, a control input signal, and an amplified output signal, the adjustable gain amplifier having a transfer function characteristic relating the amplified output signal to the received input signal responsive to the control input signal, the transfer function characteristic having an inverse transfer function characteristic, the automatic gain control method comprising the steps of:

determining an energy level error correction signal responsive to a present amplified output signal and a present control input signal;

determining a previous control input signal responsive to the signal delay means; and determining a next control input signal responsive to said energy level error correction signal and said previous control input signal to generate a next amplified output signal.

* * * * *

UNITED STATES PATENT AND TRADEMARK OFFICE
CERTIFICATE OF CORRECTION

PATENT NO. : 5,083,304
DATED : 1/21/92
INVENTOR(S) : Stephen V. Cahill It is certified that error appears in the above-identified patent and that said Letters Patent is hereby corrected as shown below:

In column 16, on line 7, insert --the amplified output signal and the control input signal incur time delays determined by a signal delay means,-- before the word "the".

In the Drawings:

In FIG. 1, delete the letter "R" above the line coupling block 111 to block 121.

Signed and Sealed this

Twelfth Day of October, 1993

Attest:

BRUCE LEHMAN

Attesting Officer

Commissioner of Patents and Trademarks